(12) United States Patent
Chen et al.

(10) Patent No.: US 9,825,008 B1
(45) Date of Patent: Nov. 21, 2017

(54) PACKAGE-ON-PACKAGE DEVICE WITH SUPPLEMENTAL UNDERFILL AND METHOD FOR MANUFACTURING THE SAME

(71) Applicant: TAIWAN SEMICONDUCTOR MANUFACTURING CO., LTD., Hsinchu (TW)

(72) Inventors: Ying-Ju Chen, Yunlin County (TW); Jie Chen, New Taipei (TW); Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/227,870

(22) Filed: Aug. 3, 2016

Related U.S. Application Data

(60) Provisional application No. 62/329,347, filed on Apr. 29, 2016.

(51) Int. Cl.
  *H01L 21/44* (2006.01)
  *H01L 21/50* (2006.01)
  (Continued)

(52) U.S. Cl.
  CPC ........ *H01L 25/0657* (2013.01); *H01L 21/561* (2013.01); *H01L 21/563* (2013.01); *H01L 21/78* (2013.01); *H01L 22/20* (2013.01); *H01L 23/3142* (2013.01); *H01L 23/481* (2013.01); *H01L 25/50* (2013.01); *H01L 24/17* (2013.01); *H01L 24/49* (2013.01); *H01L 2224/16225* (2013.01); *H01L 2224/48091* (2013.01); *H01L 2224/48106* (2013.01); *H01L 2224/48227* (2013.01); *H01L 2225/0651* (2013.01); *H01L 2225/0652* (2013.01); *H01L 2225/06517* (2013.01); *H01L 2225/06548* (2013.01); *H01L 2924/0105* (2013.01); *H01L 2924/01022* (2013.01); *H01L 2924/01024* (2013.01); *H01L 2924/01028* (2013.01);
  (Continued)

(58) Field of Classification Search
  CPC ............. H01L 23/3107; H01L 23/3114; H01L 25/0657; H01L 25/072; H01L 25/0756; H01L 25/117; H01L 21/77; H01L 21/782; H01L 21/82; H01L 33/48; H01L 33/52; H01L 33/54; H01L 33/56; H05K 13/00; H05K 13/0046; H05K 2203/1305; H05K 2203/1322
  USPC ........ 438/107, 124, 126, 127; 257/678, 686, 257/687
  See application file for complete search history.

(56) References Cited

U.S. PATENT DOCUMENTS 9,146,196 B2 * 9/2015 Babiarz ................. G01N 21/95
2016/0049389 A1 * 2/2016 Chen .................... H01L 23/5226
                                                                438/108

* cited by examiner

*Primary Examiner* — Hsien Ming Lee
(74) *Attorney, Agent, or Firm* — Maschoff Brennan

(57) ABSTRACT

A method of forming a semiconductor device includes the following operations: (i) receiving a precursor package including a precursor substrate and a plurality of semiconductor packages on the precursor substrate, in which a gap is presented between the precursor substrate and each of the semiconductor packages; (ii) forming underfill material filling the gaps; (iii) cutting the precursor substrate along a region between adjacent ones of the semiconductor packages to form a plurality of discrete package-on-package devices; and (iv) applying supplemental underfill material to one of the package-on-package devices.

17 Claims, 8 Drawing Sheets

(51) Int. Cl.
*H01L 23/02* (2006.01)
*H01L 23/22* (2006.01)
*H01L 25/065* (2006.01)
*H01L 25/00* (2006.01)
*H01L 21/56* (2006.01)
*H01L 21/78* (2006.01)
*H01L 21/66* (2006.01)
*H01L 23/31* (2006.01)
*H01L 23/48* (2006.01)
*H01L 23/00* (2006.01)

(52) U.S. Cl.
CPC ............... *H01L 2924/01029* (2013.01); *H01L 2924/01047* (2013.01); *H01L 2924/01074* (2013.01); *H01L 2924/15311* (2013.01)

PACKAGE-ON-PACKAGE DEVICE WITH SUPPLEMENTAL UNDERFILL AND METHOD FOR MANUFACTURING THE SAME

RELATED APPLICATIONS

This application claims priority to U.S. provisional Application Ser. No. 62/329,347, filed Apr. 29, 2016, which is herein incorporated by reference.

BACKGROUND

The semiconductor integrated circuit (IC) industry has experienced rapid growth. Technological progress in IC manufacture has produced several generations of ICs, and each generation fabricates smaller and more complex circuits than the previous generation. Various types of semiconductor devices performing different functions are integrated and packaged into a single assembly or package. As the demand for miniaturization, higher speed and lower power consumption, there has grown a need for smaller packaging techniques of semiconductor dies. However, as feature size scaling down continues, conventional packaging techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
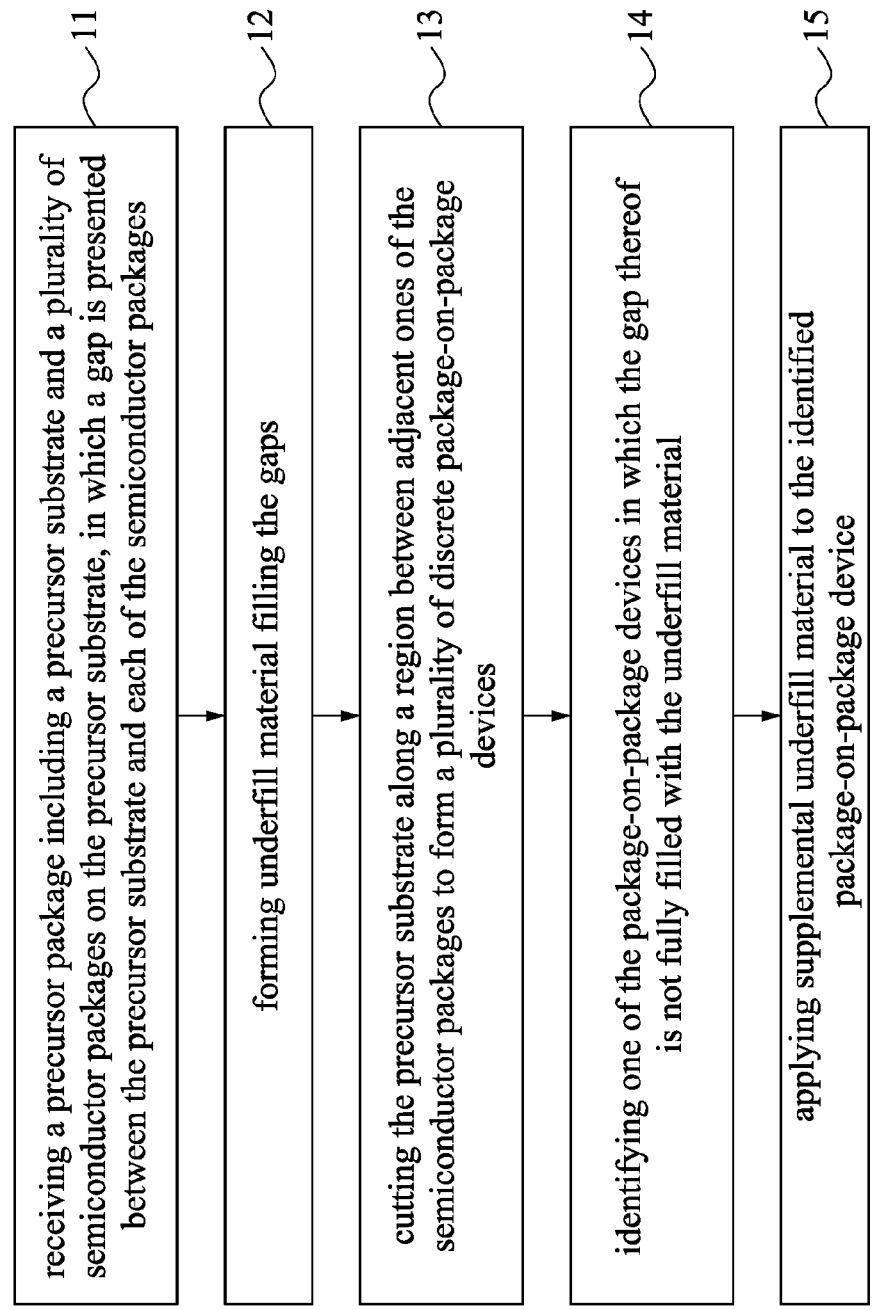
FIG. 1 is a flow chart illustrating a method of forming a semiconductor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to a semiconductor device such as for example a package-on-package device and a method of forming the semiconductor device. One of the aspects of the present disclosure is to provide a package-on-package device with improved reliability and a method of forming the package-on-package device. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flow chart illustrating a method 10 of forming a semiconductor device according to various embodiments of the present disclosure. The method 10 includes operation 11, operation 12, operation 13, operation 14 and operation 15. FIGS. 2-6 collectively illustrate more detailed manufacturing methods as a series of cross-sectional views in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 2:
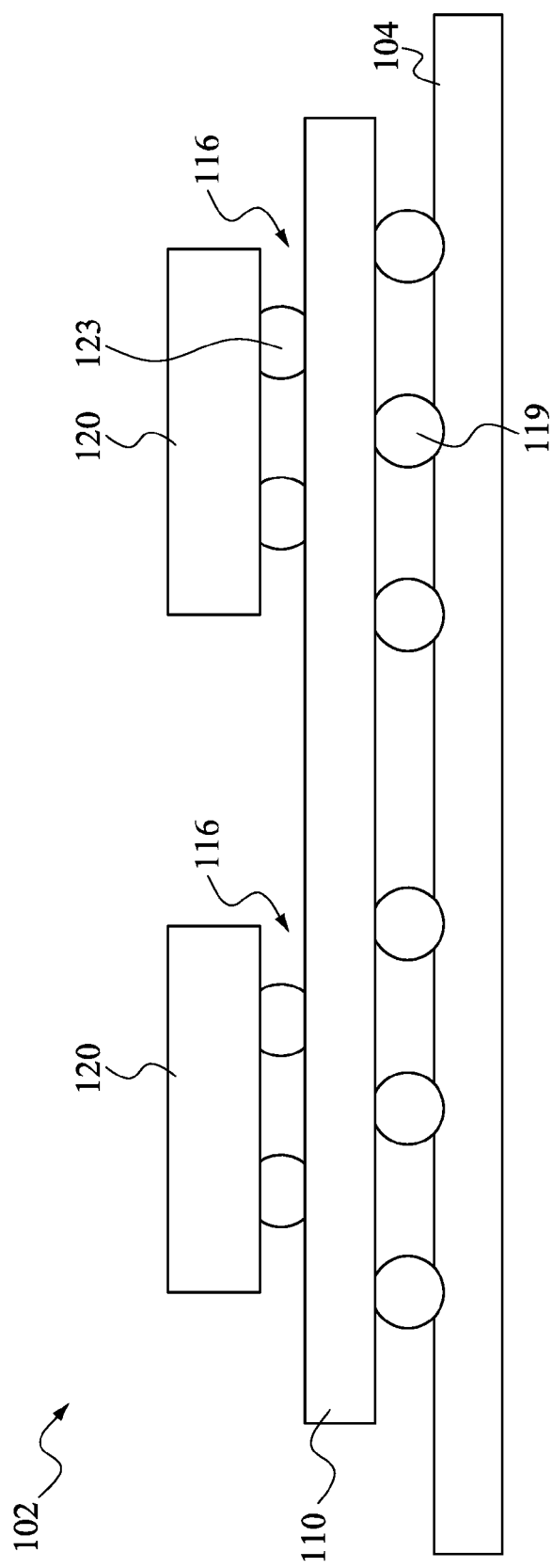
FIG. 2 is a cross-sectional view schematically illustrating a precursor package according to some embodiments of the present disclosure.

Referring to FIG. 1, the method 10 begins at the operation 11 by receiving a precursor package including a precursor substrate and a plurality of semiconductor packages on the precursor substrate, in which a gap is presented between the precursor substrate and each of the semiconductor packages. FIG. 2 is a cross-sectional view schematically illustrating a precursor package 102 according to some embodiments of the present disclosure. The precursor package 102 includes a precursor substrate 110 and a plurality of semiconductor packages 120 on the precursor substrate 110. Further, a gap 116 is presented between the precursor substrate 102 and each of the semiconductor packages 120. The precursor substrate 110 may include a plurality of units such as for example fan-out units in accordance with some embodiments of the present disclosure. Each of the semiconductor packages 120 may include one or more semiconductor chips therein, such as for example DRAM chips, logic chips, processor chips and/or the like. A carrier substrate 104 may be provided to carry the precursor package 102.

Figure 3:
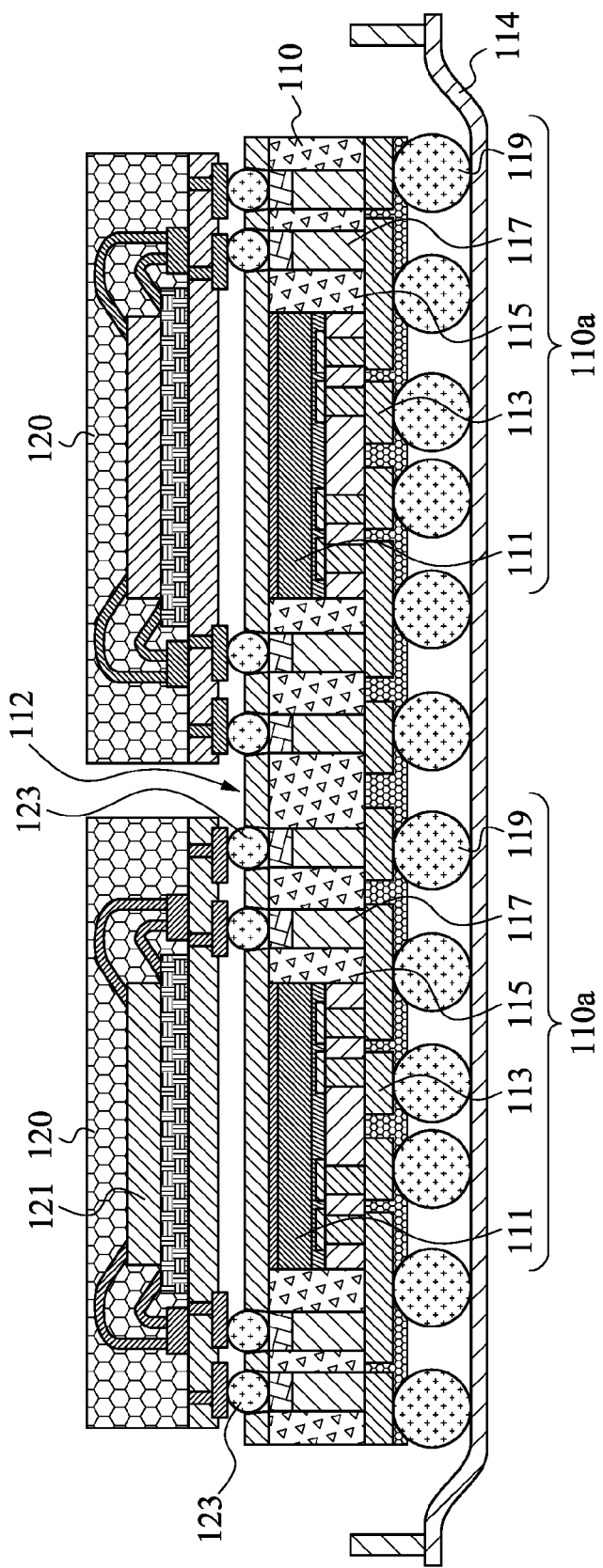
FIG. 3 is cross-sectional view illustrating more details of the precursor package according to some embodiments of the present disclosure.

FIG. 3 is cross-sectional view illustrating more details of the precursor package 102 according to some embodiments of the present disclosure. As illustrated on FIG. 3, the precursor substrate 110 includes a number of units such as for example fan-out units 110a. Each of the fan-out units 110a may include a semiconductor die 111, a redistribution layer 113, a molding layer 115, a plurality of through via structure 117, and a plurality of conductive bumps 119. One of ordinary skill in the art will appreciate that the features, examples, and embodiments described below in connection with FIG. 3 are provided for illustrative purposes only, and are not meant to limit the present disclosure in any manner.

The semiconductor die 111 may include various devices such as transistors, capacitors, resistors, diodes, photo-diodes, and/or other desired devices. The devices in the semiconductor die 111 may be interconnected to perform one or more functions such as for example memory, amplifiers, power distribution, sensors, input/output circuitry or the like. The semiconductor die 111 is electrically connected to the redistribution layer 113 through a number of vias.

The redistribution layer 113 may be a single-layered structure or a multiple-layered structure. In some examples, the redistribution layer 113 may include at least one conductive layer. The conductive layer may include conductive traces, pads, and may optionally include passive components such as resistances. In addition, the redistribution layer 113 may include at least one dielectric layer interposed between two conductive layers.

The molding layer 115 surrounds the semiconductor die 111 and disposed on the redistribution layer 113 in accordance with some embodiments of the present disclosure. The molding layer 115 may be made from a polymeric material such as for example epoxy resin, or other suitable polymers.

The through via structures 117 penetrate through the molding layer 115, and are configured to connected with the semiconductor package 120 according to some embodiments of the present disclosure. The through via structures 117 are connected to the redistribution layer 113, which is electrically connected with the semiconductor die 111 and the conductive bumps 119. In other words, the semiconductor die 111 may be electrically connected to the through via structures 117 through the redistribution layer 113. In some example, each through via structure 117 may has a height ranged from about 30 µm to about 300 µm, specifically about 50 µm to about 250 µm, more specifically about 60 µm to about 200 µm.

The conductive bumps 119 are connected to the redistribution layer 113. In yet some examples, the conductive bumps 119 may be a plurality of solder balls or the like, for example. In some examples, the solder balls may contain metallic material such as Sn, Ag and Cu, and the like. Alternatively, the conductive bumps 119 may be a plurality of land grid array (LGA) pads configured to be mounted on a print circuit board (PCB). In some examples, the conductive bumps 119 are a ball grid array (BGA) pad configured to receive other conductive bumps. In some examples, the conductive bumps 119 are disposed by electroplating operations or any other suitable operations. A plurality of UBM structures (not shown) may be formed on the redistribution layer 113 at positions where the conductive bumps 119 are mounted. The UBM structures may help to prevent diffusion between the conductive bumps 119 and the integrated circuits of the semiconductor die, and further provide a low resistance electrical connection between the conductive bumps 119 and the redistribution layer 113. In some examples, the UBM structures may include multiple layers that have an adhesion layer formed of titanium (Ti), chromium (Cr), titanium-tungsten (TiW) or the like, and a wetting layer formed of nickel (Ni), copper (Cu), or the like.

In some examples, a passivation layer may be formed between the redistribution layer 113 and the conductive bumps 119. The passivation layer may have a plurality of apertures exposing pads of the redistribution layer 113. Further, the conductive bumps 119 are mounted on the pads of the redistribution layer 113.

The semiconductor packages 120 are disposed on precursor substrate 110. In some examples, each of the semiconductor packages 120 includes at least on semiconductor chip 121 and a plurality of conductive balls 123 electrically connected to the semiconductor chip 121. The conductive balls 123 are connected to the through via structures 117 of the fan-out units 110a in the precursor substrate 110. Accordingly, the semiconductor chip 121 of the semiconductor packages 120 may be electrically connected to semiconductor die 111 of the fan-out units 110a in the precursor substrate 110 through the redistribution layer 113 and the through via structures 117. In some examples, a re-flow process may be used to bond the semiconductor packages 120 to the precursor substrate 110. In some example, the conductive balls 123 may be a ball grid array (BGA) or other bump structures suitable for coupling to the through via structures 117.

One of ordinary skill in the art will appreciate that the above features, examples, and embodiments in connection with FIG. 3 are provided for illustrative purposes only, and are not meant to limit the present disclosure in any manner.

Figure 4:
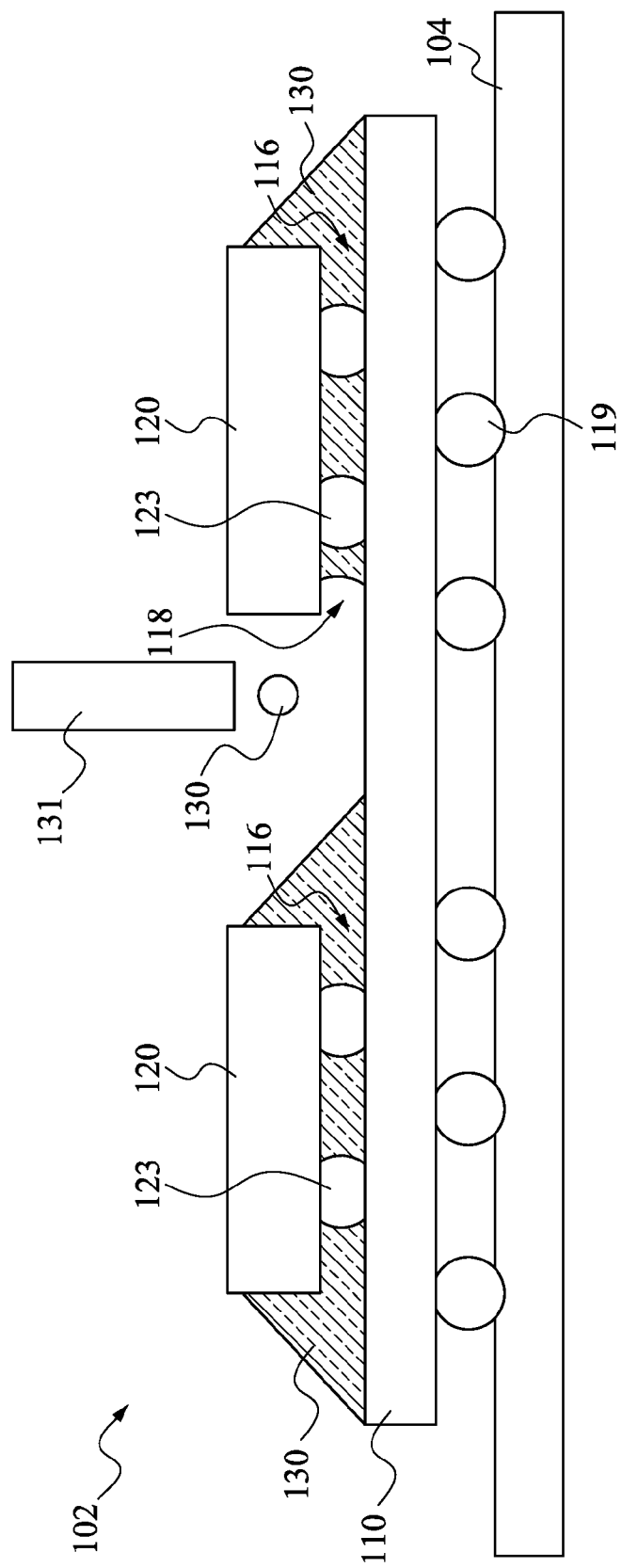
FIG. 4-6 are cross-sectional views schematically illustrating a method of forming a semiconductor device in various process stages according to various embodiment of the present disclosure.

Referring to FIGS. 1 and 4, the method 10 proceeds to the operation 12 by forming underfill material 130 filling the gaps 116. In some embodiments, a dispenser 131 may be used to supply the underfill material to fill the gaps 116 between the precursor substrate 110 and the semiconductor packages 120. Thereafter, a curing process may be carried out to harden the underfill material 130. In particular, the underfill material may be provided in a fluid form, and is hardened after the curing process. For example, the underfill material may include epoxy resin.

In some embodiment, the underfill material substantially fills the entity of each gap 116. However, some of the gaps are not completely filled with the underfill material, and a void region such as void region 118 appears in certain gaps. The void region 118 in the gap would cause several reliability issues, and that will be described in detail hereinafter.

Figure 5:
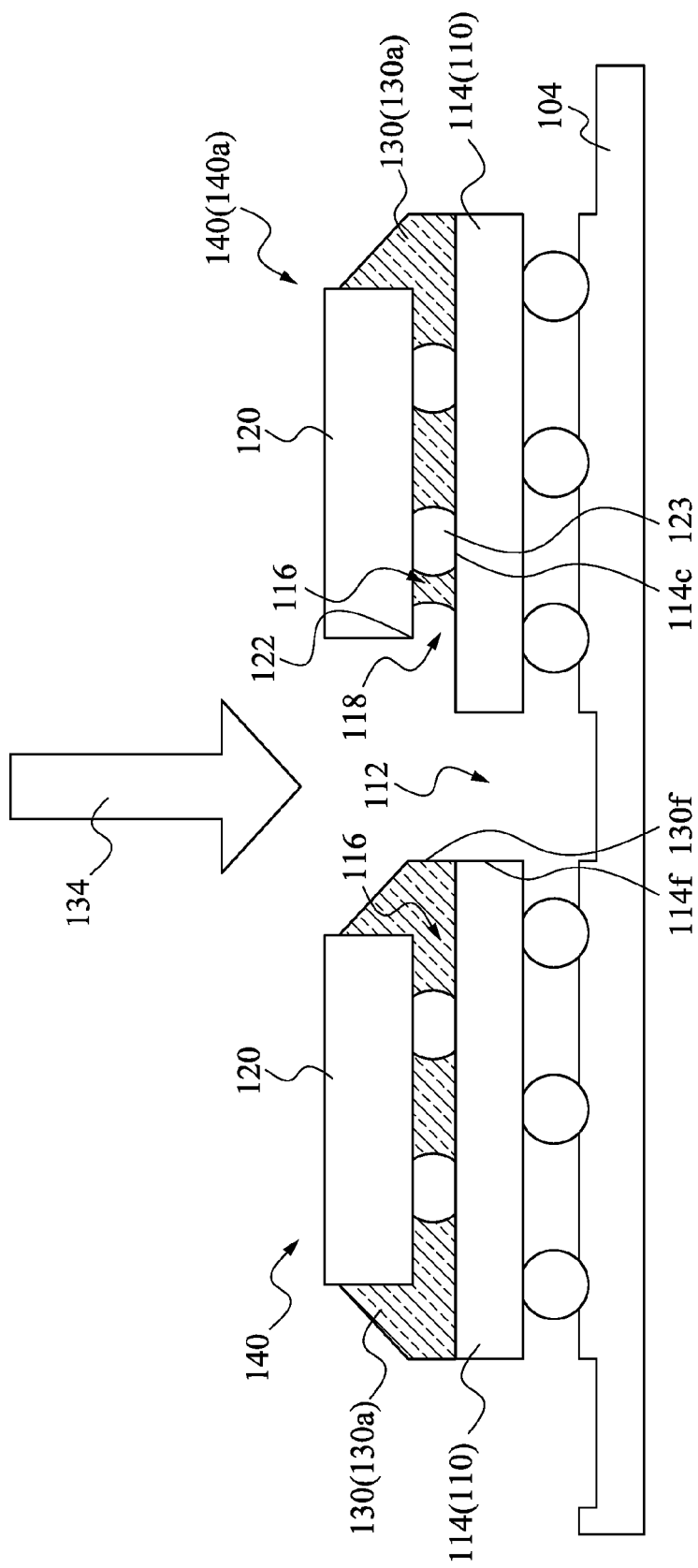

Referring to FIGS. 1 and 5, the method 10 proceeds to the operation 13 by cutting the precursor substrate 110 along a region 112 between adjacent ones of the semiconductor packages 120 to form a plurality of discrete package-on-package devices 140. The operation 13 may also be referred to as a singulation process 134, which produces discrete package-on-package devices 140 from the precursor package 102.

The operation of cutting the precursor substrate 110 may be carried out along a scribe line region 112 of the precursor substrate 110. The scribe line region 112 is predetermined and located between adjacent semiconductor packages 120. In some example, referring back to FIG. 3, the scribe line region 112 is defined in the spacing between adjacent fan-out units 110a of the precursor substrate 110. Therefore, after cutting the precursor substrate 110, the precursor substrate 110 is transformed into a plurality of fan-out packages 114, and each fan-out package 114 includes one of the fan-out units 110a. In some embodiments, each of the package-on-package devices 140 includes a fan-out package 114, a semiconductor package 120 on the fan-out package 114, and an underfill 130a filled in the gap between the fan-out package and the semiconductor package. In some examples, the obtained package-on-package devices 140 are substantially identical in structure.

In some embodiments, the operation of cutting the precursor substrate 110 may include a sawing process, a laser cutting process, or a knife cutting process, or the like. The cutting process cuts the precursor substrate 110 and the underfill material 130, and therefore the fan-out package 114 and the underfill material 130 respectively have a cutting edge 114f, 130f. Furthermore, the cutting edge 130f of the underfill material 130 is substantially aligned with the cutting edge 114f of the fan-out package 114.

As described hereinbefore, the underfill 130a substantially fills the entire gap 116 between the fan-out package 114 and the semiconductor package 120 in some embodiments of the present disclosure. However, the gap 116 of certain package-on-package device, such as the package-on-package device 140a, is not completely filled with the underfill 130a, and a void region 118 is presented in the gap. The void region 118 is adjacent to an edge 122 of the semiconductor package 120.

It has been found that the underfill not only influences the adhesive strength between the semiconductor package 120 and the fan-out package 114, but also the reliability of the conductive balls 123. In some cases, the void region 118 appears at the edge of the semiconductor packages 120, and that leads to an uncompleted protection of the conductive balls 123 near the void region 118. After a thermal reliability test, in the region near the void region 118, an interfacial crack may be observed at the interfaces between the conductive balls 123 and the contacts 114c of the fan-out package 114. The interfacial crack further causes a poor electrical connection between the semiconductor package 120 and the fan-out package 114. In some embodiments, a top surface of the through via structure 117 shown in FIG. 3 serves the contact 114c. In yet some cases, some of the conductive balls 123 near the void region 118 are short or bridged after thermal reliability test. The short or bridge between these conductive balls 123 may lead to the failure in the electrical connection. Accordingly, one aspect of the present disclosure is to provide a solution to these issues.

Referring to FIG. 1, the method 10 proceeds to the operation 14 by identifying one of the package-on-package devices in which the gap thereof is not fully filled with the underfill material. In some embodiments, an inspection process may be performed to identify the package-on-package devices with void region in the gap, such as the package-on-package device 140a. In some examples, the inspection process may include: (i) judging whether the underfill material 130 fully fills the gap 116 of each package-on-package device 140 or not; and (ii) identifying the package-on-package device 140a with void region 118 in the gap from the package-on-package devices 140. The inspection process may include visual inspection or mechanical inspection using radiation such as X-ray. For examples, when one finds a package-on-package device having void in the gap, this package-on-package device is picked up or labeled.

Figure 6:
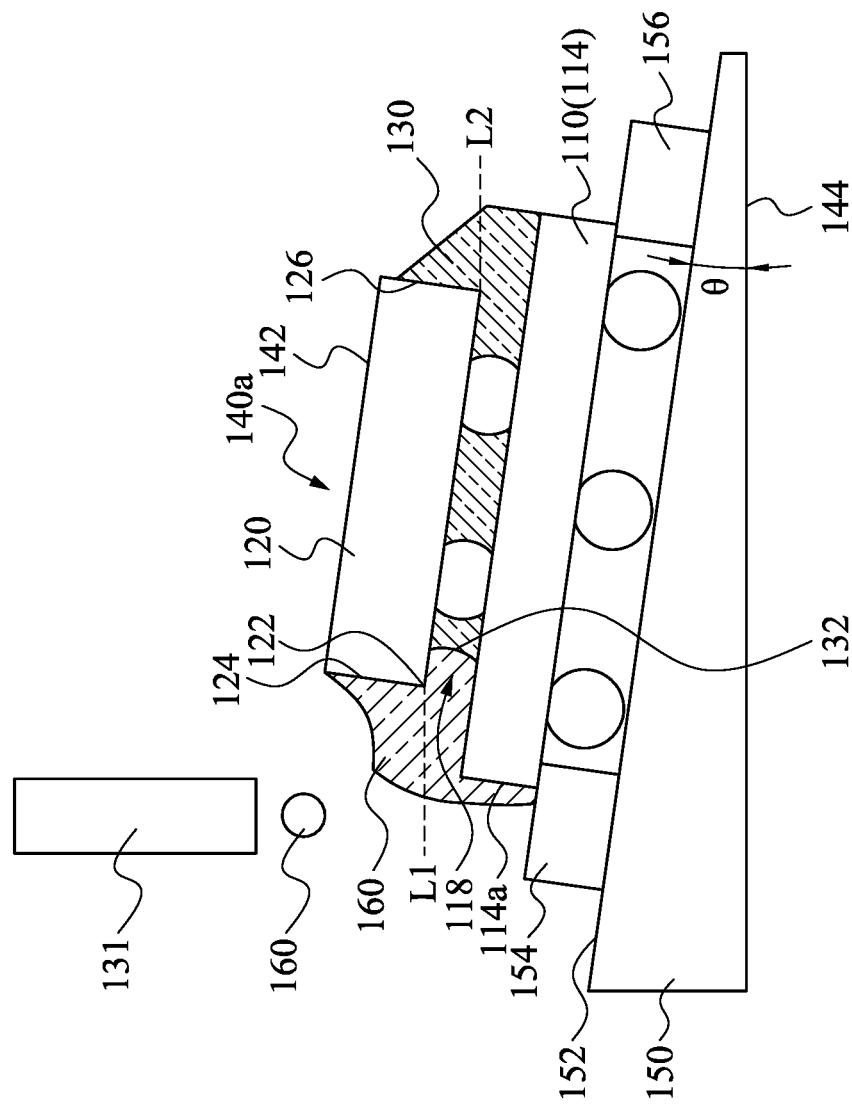

Referring to FIGS. 1 and 6, the method 10 proceeds to the operation 15 by applying supplemental underfill material 160 to the identified package-on-package device 140a. In various embodiments, the supplemental underfill material 160 is supplied to the void region 118 in the gap of the identified package-on-package device 140a. For example, the supplemental underfill material 160 may be provided in a liquid form, and a dispenser 131 may be used to inject or apply the supplemental underfill material 160 to the void region 118. The supplemental underfill material 160 may be hardened by a curing process after applying the supplemental underfill material 160 to the identified package-on-package device 140a.

According to some embodiments of the present disclosure, applying supplemental underfill material 160 to the identified package-on-package device 140a includes the following acts: (i) tilting the identified package-on-package device 140a; and then (ii) applying the supplemental underfill material 160 to the void region 118 in the gap of the identified package-on-package device 140a. Specifically, the package-on-package device 140a is tilted to an angle θ prior to supplying the supplemental underfill material 160. Tilting the package-on-package device 140a allows a surface 142 of the package-on-package device 140a and a horizontal plane 144 to form an angle θ of approximately 10-40 degrees, specifically about 15-30 degrees. The void region 118 is adjacent to a sidewall 124 of the semiconductor package 120, so that the sidewall 124 adjacent to the void region 118 is positioned at a level L1 higher than a level L2 of another sidewall 126 opposite to the sidewall 124. Tilting the package-on-package device 140a may facilitate the supplemental underfill material 160 to flow into the void region 118 by the gravity. When the angle θ is less than a certain value, for example 10 degrees, the effect of the gravity is insignificant. On the other hand, when the angle θ is greater than a certain value, for example 40 degrees, it is difficult to control the flowing of the supplemental underfill material 160, and the supplemental underfill material 160 possibly overflows to an undesired position. Accordingly, the angle θ may be in the range of approximately 10-40 degrees.

In some embodiments, tilting the package-on-package device 140a includes the steps described below. First, a carrier substrate 150 having an inclined plane 152 is provided. The inclined plane 152 forms an angle θ of approximately 10-40 degrees with a horizontal plane 144. Specifically, the angle θ may be approximately 15-30 degrees. After providing the carrier substrate 150, the package-on-package device 140a is disposed on the inclined plane 152 of the carrier substrate 150. In some examples, the carrier substrate 150 may include one or more positioning members 154, 156 on the inclined plane 152. The positioning members 154, 156 may facilitate the package-on-package device 140a to be fixed at a desired location.

In some embodiments, an edge 132 of the underfill material 130 of the package-on-package device 140a constitutes a boundary of the void region 118, and the supplemental underfill material 160 filled in the void region 118 is in contact with the edge 132 of the underfill material 130.

In some embodiments, the supplemental underfill material 160 has a composition that is the same as a composition of the underfill material 130. However, in yet some embodiments, the material of the supplemental underfill material 160 is different from the material of the underfill material 130. For example, the supplemental underfill material 160 may have a glass transition temperature that is less than a glass transition temperature of the underfill material 130. Therefore, the supplemental underfill material 160 may be cured at a relatively lower temperature. When curing the supplemental underfill material 160, the underfill material 130 previously hardened is not unfavorably influenced or damaged since the underfill material 130 has a relatively higher glass transition temperature.

The supplemental underfill material 160 may have a variety of boundaries or edges although FIG. 6 depicts that the supplemental underfill material 160 covers a lateral surface 114a of the fan-out package 114. For example, the supplemental underfill material 160 may stop at the edge of the fan-out package 114, and the lateral surface 114a is not covered by the supplemental underfill material 160. The details of the different boundaries of the supplemental underfill material 160 are described hereinafter.

Figure 7:
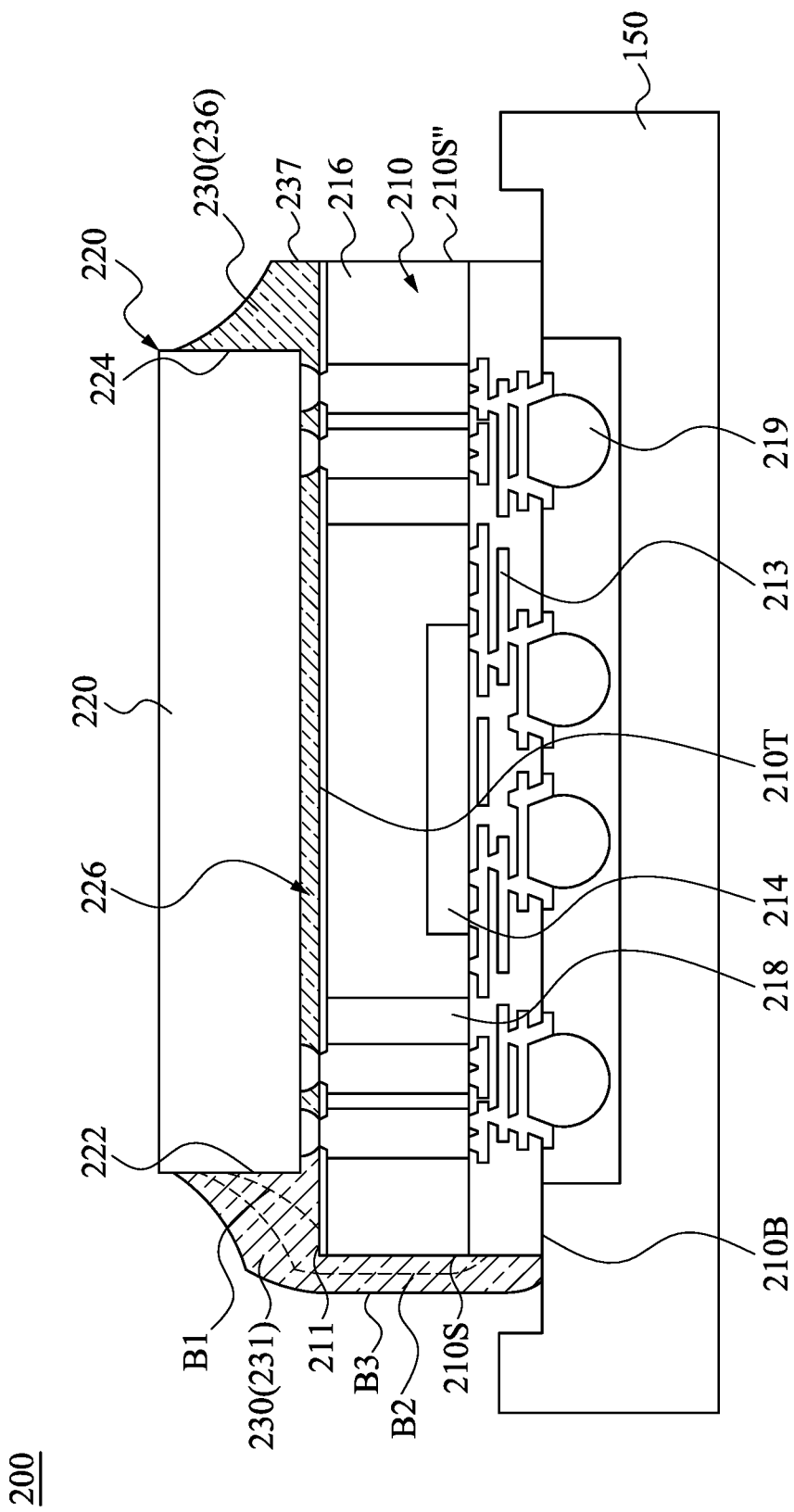
FIG. 7 is a cross-section view schematically illustrating a package-on-package structure according to various embodiments of the present disclosure.

After the operation 15 of applying supplemental underfill material 160, a package-on-package structure is obtained. FIG. 7 is a cross-section view schematically illustrating a package-on-package structure 200 manufactured by method 10 illustrated in FIG. 1 according to some embodiments of the present disclosure. The package-on-package structure 200 includes a first semiconductor package 210, a second semiconductor package 220, and an underfill 230.

The first semiconductor package 210 has a top surface 210T and a lateral surface 210S adjacent to the top surface 210T. In some embodiments, the first semiconductor package 210 includes a redistribution layer 213, a semiconductor die 214, a molding layer 216, and at least a through via contact 218, and a plurality of conductive bumps 219.

The redistribution layer 213 may have a multiple-layered structure. The conductive bumps 219 are beneath the redistribution layer 213, and electrically connected to the redistribution layer 213. The redistribution layer 213 is further electrically connected to the semiconductor die 214 and the through via contact 218. The molding layer 216 is disposed on the redistribution layer 213 and surrounds the semiconductor die 214. The through via contact 218 penetrates through the molding layer 216. Further, the through via contact 218 electrically interconnects the redistribution layer 213 with the second semiconductor package 220. In some embodiments, the first semiconductor package 210 may be the fan-out packages 114 described hereinbefore.

The second semiconductor package 220 is disposed over the top surface 210T of the first semiconductor package 210 and has a side surface 222. A gap 226 is presented between the second semiconductor package 220 and the first semiconductor package 210. In some embodiments, the second semiconductor package 220 is smaller than the first semiconductor package 210 in size. For examples, the area of the second semiconductor package 220 is smaller than that of the first semiconductor package 210. In some embodiments, the second semiconductor package 220 may be the semiconductor packages 120 described hereinbefore.

The underfill 230 is connected to the first semiconductor package 210 and the second semiconductor package 220. In various embodiments, the underfill 230 includes a first underfill portion 231 and a second underfill portion 236. The first underfill portion 231 is in contact with the side surface 222 of the second semiconductor package 220 and the top surface 210T of the first semiconductor package 210. It is noted that the first underfill portion 231 is free of a cutting edge that is substantially aligned with the lateral surface 210S of the first semiconductor package 210.

In some embodiments, the first underfill portion 231 of the underfill 230 is associated with the supplemental underfill material described hereinbefore. The first underfill portion 231 may have different kinds of boundaries such as boundary B1, boundary b2, and boundary B3. In some examples, the first underfill portion 231 has a boundary B1, in which an edge portion 211 of the top surface 210T is exposed out of the first underfill portion 231. In other words, at least an edge portion of the top surface 210T of the first semiconductor package 210 is not occupied by the underfill 230. In yet some examples, the first underfill portion 231 has a boundary B2, in which the first underfill portion 231 covers a portion of the lateral surface 210S of the first semiconductor package 210.

Figure 8:
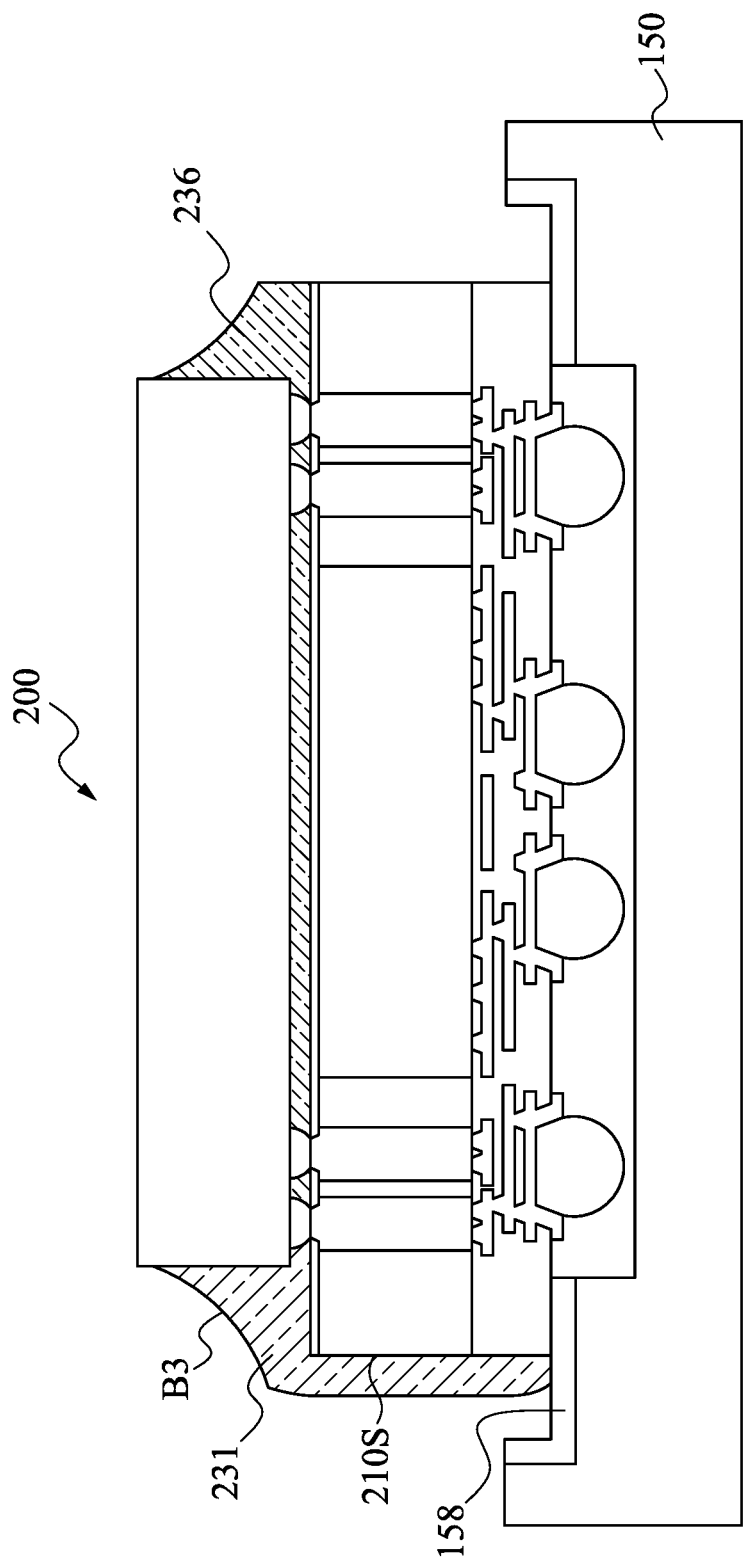
FIG. 8 is cross-sectional view schematically showing a package-on-package structure and a carrier substrate having a detach layer according to some embodiments of the present disclosure.

In yet some examples, the first underfill portion 231 has a boundary B3, in which the first underfill portion 231 extends from the top surface 210T to the lateral surface 210S at a position adjacent to the bottom surface 210B of the first semiconductor package 210. In these examples, when applying supplemental underfill material to the void region, the supplemental underfill material overflows to the carrier substrate 150 along the lateral surface 210S. The supplemental underfill material possibly adheres to the carrier substrate 150, and that possibly cause a problem in separating the package-on-package structure 200 from the carrier substrate 150. In order to resolve this problem, the carrier substrate 150 may include a detach layer in terms of the convenience of the manufacturing process. FIG. 8 is cross-sectional view schematically showing the package-on-package structure 200 and a carrier substrate 150 having a detach layer 158. When the supplemental underfill material overflows to the carrier substrate 150 along the lateral surface 201S, the detach layer 158 may facilitate the first underfill portion 231 to be detach from the detach layer 158, and therefore the package-on-package structure 200 may be separated form the carrier substrate 150. The detach layer 158 may include any suitable material that has a small adhesion with the first underfill portion 231. For example, the detach layer 158 may include fluorine-containing polymer.

Referring back to FIG. 7, the second underfill portion 236 is in contact with another side surface 224 of the second semiconductor package 220 and the top surface 210T of the first semiconductor package 210. The second underfill portion 236 include a cutting edge 237 that is substantially aligned with an lateral surface 210S" of the first semiconductor package 210. In some embodiments, the second underfill portion 236 of the underfill 230 is associated with the underfill material 130 described hereinbefore. Further, both the first and second underfill portions 231, 236 may extend into a gap 226 between the first and the second semiconductor packages 210, 220.

Advantages of various embodiments of the present disclosure include providing a novel method for manufacturing a package-on-package device, in which a supplemental underfill material is additionally applied. The supplemental underfill material fills the void region in the gap of the package-on-package device, and therefore the reliability of the package-on-package device is improved. Additionally, a novel package-on-package structure is provided. A first underfill portion and a second underfill portion are provided to the package-on-package structure. The first and second underfill portions collectively secure the electrical connection of the package-on-package.

In accordance with one aspect of some embodiments, a method of forming a semiconductor device includes the following operations: (i) receiving a precursor package including a precursor substrate and a plurality of semiconductor packages on the precursor substrate, in which a gap is presented between the precursor substrate and each of the semiconductor packages; (ii) forming underfill material filling the gaps; (iii) cutting the precursor substrate along a region between adjacent ones of the semiconductor packages to form a plurality of discrete package-on-package devices; and (iv) applying supplemental underfill material to one of the package-on-package devices.

In accordance with one aspect of some embodiments, a method 10 of forming a storage device includes the following operations: (i) receiving a precursor package including a precursor substrate and a plurality of semiconductor packages on the precursor substrate, in which a gap is presented between the precursor substrate and each of the semiconductor packages; (ii) applying underfill material into the gaps; (iii) cutting the precursor substrate along a region between adjacent ones of the semiconductor packages to form a plurality of discrete package-on-package devices, in which each of the package-on-package devices includes a portion of the precursor substrate, one of the semiconductor packages on the portion of the precursor substrate, and a portion of the underfill material between the so-called one of the semiconductor packages and the portion of the precursor substrate; (iv) identifying one of the package-on-package devices in which the gap thereof is not fully filled with the underfill material; and (v) supplying supplemental underfill material to a void region in the gap of said one of the package-on-package devices.

In accordance with another aspect of some embodiments, a package-on-package structure includes a first semiconductor package, a second semiconductor package, and an underfill. The first semiconductor package has a top surface and a lateral surface adjacent to the top surface. The second semiconductor package is disposed over the top surface of the first semiconductor package, and has a side surface. The underfill is connected to the first semiconductor package and the second semiconductor package. The underfill includes a first underfill portion in contact with the top surface of the first semiconductor package and the side surface of the second semiconductor package, and the first underfill portion is free of a cutting edge that is substantially aligned with the lateral surface of the first semiconductor package.

What is claimed is:

1. A method, comprising:
   receiving a precursor package, the precursor package comprising:
      a precursor substrate; and
      a plurality of semiconductor packages on the precursor substrate, wherein a gap is presented between the precursor substrate and each of the semiconductor packages;
   forming underfill material filling the gaps;
   cutting the precursor substrate along a region between adjacent ones of the semiconductor packages to form a plurality of discrete package-on-package devices; and
   applying supplemental underfill material to one of the discrete package-on-package devices, wherein applying the supplemental underfill material to the one of the discrete package-on-package devices comprises:
      tilting the one of the discrete package-on-package devices; and
      applying the supplemental underfill material to a void region in the gap of the one of the discrete package-on-package devices.

2. The method according to claim 1, further comprising inspecting the underfill material in the gaps of the discrete package-on-package devices after cutting the precursor substrate, prior to applying the supplemental underfill material.

3. The method according to claim 2, wherein inspecting the underfill material in the gaps of the discrete package-on-package devices comprises:
   judging whether the underfill material fully fills the gap of each discrete package-on-package device or not; and
   identifying the one of the discrete package-on-package devices from the discrete package-on-package devices, wherein the gap of the one of the discrete package-on-package devices is not fully filled by the underfill material.

4. The method according to claim 1, wherein each discrete package-on-package device comprises one of the semiconductor packages, and the void region is adjacent to an edge of the one of the semiconductor packages.

5. The method according to claim 1, wherein tilting the one of the discrete package-on-package devices comprises allowing a principal surface of the one of the discrete package-on-package devices to form an angle of approximately 10-40 degrees with a horizontal plane.

6. The method according to claim 1, wherein tilting the one of the discrete package-on-package devices comprises:
   providing a carrier substrate having an inclined plane, the inclined plane forming an angle of approximately 10-40 degrees with a horizontal plane; and
   disposing the one of the discrete package-on-package devices on the inclined plane.

7. The method according to claim 1, wherein the underfill material has a composition that is the same as a composition of the supplemental underfill material.

8. The method according to claim 1, wherein the underfill material has a glass transition temperature greater than a glass transition temperature of the supplemental underfill material.

9. A method, comprising
   receiving a precursor package, the precursor package comprising:
      a precursor substrate; and
      a plurality of semiconductor packages on the precursor substrate, wherein a gap is presented between the precursor substrate and each of the semiconductor packages;
   forming underfill material filling the gaps;
   cutting the precursor substrate along a region between adjacent ones of the semiconductor packages to form a plurality of discrete package-on-package devices; and
   applying supplemental underfill material to one of the discrete package-on-package devices, wherein applying the supplemental underfill material to the one of the discrete package-on-package devices comprises:
      tilting the one of the discrete package-on-package devices; and
      applying the supplemental underfill material to an edge of the underfill material in the gap of the one of the discrete package-on-package devices.

10. A method, comprising:
    receiving a precursor package, the precursor package comprising:
       a precursor substrate; and
       a plurality of semiconductor packages on the precursor substrate, wherein a gap is presented between the precursor substrate and each of the semiconductor packages;
    applying underfill material into the gaps;
    cutting the precursor substrate along a region between adjacent ones of the semiconductor packages to form a plurality of discrete package-on-package devices, wherein each of the discrete package-on-package devices comprises a portion of the precursor substrate, one of the semiconductor packages on the portion of the precursor substrate, and a portion of the underfill material between said one of the semiconductor packages and the portion of the precursor substrate;

identifying one of the discrete package-on-package devices in which the gap thereof is not fully filled with the underfill material; and supplying supplemental underfill material to a void region in the gap of said one of the discrete package-on-package devices.

11. The method according to claim 10, wherein supplying the supplemental underfill material to the void region of said one of the discrete package-on-package devices comprises:

tilting said one of the discrete package-on-package devices, wherein the void region is adjacent to a sidewall of the semiconductor package of said one of the discrete package-on-package devices, and the sidewall adjacent to the void region is positioned at a level higher than a level of another sidewall opposite to the sidewall; and applying the supplemental underfill material to the void region.

12. The method according to claim 11, wherein tilting said one of the discrete package-on-package devices comprises allowing a principal surface of said one of the discrete package-on-package devices to form an angle of approximately 15-30 degrees with a horizontal plane.

13. The method according to claim 11, wherein tilting said one of the discrete package-on-package devices comprises:

providing a carrier substrate having an inclined plane, wherein the inclined plane forms an angle of approximately 15-30 degrees with a horizontal plane; and disposing said one of the discrete package-on-package devices on the inclined plane.

14. A package-on-package structure, comprising:

a first semiconductor package having a top surface and a lateral surface adjacent to the top surface;

a second semiconductor package disposed over the top surface of the first semiconductor package and having a side surface; and an underfill connected to the first semiconductor package and the second semiconductor package, the underfill comprising:

a first underfill portion in contact with the top surface of the first semiconductor package and the side surface of the second semiconductor package, wherein the first underfill portion is free of a cutting edge that is substantially aligned with the lateral surface of the first semiconductor package; and a second underfill portion in contact with the top surface of the first semiconductor package and another side surface of the second semiconductor package, and the second underfill portion includes the cutting edge that is substantially aligned with the lateral surface of the first semiconductor package, wherein both the first and second underfill portions extend into a gap between the first and the second semiconductor packages.

15. The package-on-package structure according to claim 14, wherein the first underfill portion covers at least a portion of the lateral surface of the first semiconductor package.

16. The package-on-package structure according to claim 14, wherein an edge portion of the top surface of the first semiconductor package is exposed out of the first underfill portion.

17. The package-on-package structure according to claim 14, wherein the first semiconductor package comprises:

a redistribution layer;

a semiconductor die electrically connected to the redistribution layer;

a molding layer disposed on the redistribution layer and surrounding the semiconductor die; and at least a through via contact passing through the molding layer, wherein the through via contact electrically interconnects the redistribution layer and the second semiconductor package.

* * * * *